US006475859B1

(12) United States Patent
Tews et al.

(10) Patent No.: US 6,475,859 B1
(45) Date of Patent: Nov. 5, 2002

(54) PLASMA DOPING FOR DRAM WITH DEEP TRENCHES AND HEMISPHERICAL GRAINS

(75) Inventors: Helmut Horst Tews, Poughkeepsie; Brian S. Lee, New York, both of NY (US); Joachim Hoepfner, Planegg (DE)

(73) Assignee: Infineon Technologies AG, Munich (DE)

( * ) Notice: Subject to any disclaimer, the term of this patent is extended or adjusted under 35 U.S.C. 154(b) by 75 days.

(21) Appl. No.: 09/593,287

(22) Filed: Jun. 13, 2000

(51) Int. Cl.[7] .......................................... H01L 21/8242
(52) U.S. Cl. ..................... 438/243; 438/246; 438/249; 438/255; 438/386; 438/389; 438/392; 438/398
(58) Field of Search ................................ 438/243, 245, 438/246, 247, 248, 249, 255, 386, 388, 389, 390, 391, 392, 398

(56) References Cited

U.S. PATENT DOCUMENTS

| | | | | |
|---|---|---|---|---|
| 4,937,205 A | * | 6/1990 | Nakayama et al. | 438/513 |
| 6,008,103 A | * | 12/1999 | Hoepnfer | 438/386 |
| 6,159,874 A | * | 12/2000 | Tews et al. | 438/255 |
| 6,177,696 B1 | * | 1/2001 | Bronner et al. | 257/301 |
| 6,319,788 B1 | * | 11/2001 | Gruening et al. | 438/386 |

OTHER PUBLICATIONS

Yu et al., Trench Doping Conformality by Plasma Immersion Ion Implantation (PIII), IEEE Electron Device Letters, vol.: 15, Issue 6, Jun. 1994, pp.: 196–198.*

Theodore et al., "Micro–Processing Using Plasma Source Ion Implantation", University/Government/Industry Microelectronics Symposium, 2001 Proceedings of the Fourteenth Biennial, 2001, pp.: 126–127.*
Lee et al., "Plasma Immersion Ion Implantation As an Alternative Deep Trench Buried–Plate Doping Technology", Conference on Ion Implantation Technology, 2000, pp.: 460–463.*
Wolf et al., "Chemical Vapor Deposition of Amorphous and Polycrystalline Films", Silicon Processing For the VLSI Era, vol. 1: Process Technology, Lattice Press, California, pp.: 191–194.*
Wolf et al., "Ion Implantation For VLSI", Silicon Processing For the VLSI Era, vol. 1: Process Technology, Lattice Press, California, pp.: 303–305.*

* cited by examiner

Primary Examiner—Carl Whitehead, Jr.
Assistant Examiner—Toniae M. Thomas
(74) Attorney, Agent, or Firm—Stanton Braden

(57) ABSTRACT

A method of doping trench sidewall and hemispherical-grained silicon in deep trench cells to increase surface area and storage capacitance while avoiding deformation of trenches and hemispherical-grained silicon, comprising:
  a) Etching a deep trench structure by reactive ion etching;
  b) Forming a LOCOS collar in an upper portion of the trench over a conformal layer of a silicon containing material, the collar leaving a lower portion of the trench exposed;
  c) Depositing a film of hemispherical-grained silicon (HSG-Si) at sidewalls of the deep trench;
  d) Plasma doping the hemispherical-grained silicon; and
  e) Depositing a node dielectric and filling the trench with polysilicon.

7 Claims, No Drawings

PLASMA DOPING FOR DRAM WITH DEEP TRENCHES AND HEMISPHERICAL GRAINS

BACKGROUND OF THE INVENTION

1. Field of Invention

The present invention relates to the use of plasma doping (PLAD) for a DRAM with deep trenches (DT) in hemispherical grains (HSG) as an alternative to arsenic glass (ASG) doping and gas-phase doping to prevent deformation of narrow trench structures and hemispherical grains, and thereby insure high capacitance.

2. Description of the Related Art

In general, increasing the density of integrated circuit devices is accomplished in part by decreasing the size of the structures within the devices (such as wiring lines and transistor gate widths and by decreasing the separation between the structures which make up the integrated circuit devices).

Reducing the size of circuit structures is referred to as decreasing the "design rules" used for the manufacture of the integrated circuit device. For semiconductor memories of the dynamic random access type, i.e., "DRAMs," information is stored by varying the amount of charge stored within each capacitor of an array of capacitors formed on the surface of a semiconductor substrate. Often, a single bit of binary information is stored at each capacitor by associating a discharged capacitor state with a logical zero and a charged capacitor state with a logical one. Each of the memory capacitors in a typical DRAM has a parallel plate structure. The surface area of the plates of the memory capacitor determines the amount of charge that can be stored on the capacitor, given the fixed operating voltage of a typical memory device, the plate separation that can reliably be manufactured, and the dielectric constant of the capacitor dielectric used in the capacitors.

Reducing the size of a DRAM capacitor in accordance with reduced design rules reduces the surface area of the capacitor plates and therefore has the effect of reducing the amount of charge that can be stored on the memory capacitor.

Plates of memory capacitors must be larger than a minimum size to obtain reliable operation of the memory. For ultra large scale integration ("ULSI") DRAM designs, bit line capacitances, sense amplifier sensitivities and noise signals are such that further reductions in the amount of charge stored on the DRAM memory capacitors could prevent the information stored on the capacitor from reliably being read out. Because charge inevitably drains from memory capacitors, DRAMs require the periodic refreshing of the charge stored on the capacitors of the DRAM to ensure that the stored charge remains above the minimum detectable level. Further reductions in capacitor size require more frequent refresh operations for the DRAM, which are undesirable because at least portions of the DRAM are unavailable for reading and writing of information during refresh operations.

Therefore, to meet the challenges of reduced design rules, DRAM designs are employed which incorporate capacitors having vertical extensions above the surface of the substrate (i.e., "stacked") or below the surface of the substrate (i.e., "trenched"). By adopting a more three-dimensional structure via the stacked or trenched designs, these DRAM designs provide memory capacitors having larger capacitances that consume less of the substrate surface area.

Where the stacked capacitor and trench capacitor designs involve more complicated structures, which are more difficult to manufacture, these designs have been adopted with a significant degree of success.

Nevertheless, there additionally remains a need to further increase the capacitance of DRAM storage capacitors while decreasing the amount of surface area consumed by the DRAM storage capacitor on the surface of the semiconductor substrate.

One method for increasing the capacitance for a fixed substrate surface area is to use textured polysilicon as the bottom plate for the memory capacitor. The layer of textured polysilicon is used as the lower electrode for the capacitor, a thin dielectric layer covers the surface of the lower electrode, and a cell plate is formed on the dielectric layer to serve as the upper electrode for the capacitor. By using textured polysilicon as the lower electrode of the capacitor, the surface area of the capacitor is increased without extending the capacitor electrodes laterally, so that the structure has improved capacitance for a fixed surface area.

U.S. Pat. No. 5,753,559 disclose a method for increasing the capacitance of a DRAM storage capacitor by utilizing textured surfaces of plasma deposited grown hemispherical grained silicon (HSG-Si) on polysilicon. The method for making the device comprises providing to a deposition system a substrate having an exposed surface of a conductor comprising silicon; generating a plasma region within the deposition system; providing a reactant gas comprising silicon to the deposition system so that ions comprising silicon are generated within the deposition system and transported to the exposed surface; and depositing a layer of HSG-Si on the exposed surface of the conductor comprising silicon.

A method for roughening and volume expansion of trench sidewalls to form a high capacitance trench cell for high density DRAM applications in disclosed in U.S. Pat. No. 5,877,061. The method entails: forming a trench in a substrate through an opening in a dielectric mask material positioned on the substrate; depositing a conformal layer of silicon containing material over the dielectric etch mask material and into the trench; forming a collar oxide in an upper portion of the trench over the conformal layer of silicon containing material, said collar oxide leaving a lower portion of the trench exposed; and isotropically etching the silicon containing material and the substrate under the silicon containing material in the lower portion of the trench.

Despite the fact that storage capacity or wall surface area in DRAMs have been increased by providing horizontal trenches created in sidewalls; providing porous layers on the trench surfaces; utilizing sidewalls comprising multiple layers which are selectively etched to produce a roughened surface with increased surface area; and doping of a surface layer in a trench with a crystal having a different structure than the material in the surface layer, each of these methods increase production time and processing cost.

Nevertheless, for the sake of providing even higher capacitance when using hemispherical-grained silicon on sidewalls in trenches in a capacitor, it is still essential to achieve very high doping levels in the hemispherical grains, which act as an electrode.

Even though high doping concentrations must be used in the surface layer of trenched sidewalls in hemispherical grains to attain even higher capacitance DRAMS, the achievement of this high doping must unfortunately be done by arsenic glass (ASG) doping and gas-phased doping.

These doping techniques either require the use of very high temperatures that result in a viscous flux of Si that leads to a deformation of trenches and the very small hemispherical grains or are very complicated and not applicable for smaller ground rule devices (i.e., 0.18 μm or smaller) due to a depletion of source materials and process complexity.

SUMMARY OF THE INVENTION

One object of the present invention is to provide a process for doping of the surface layer of a trench sidewall and hemispherical grains by avoiding the use of arsenic glass (ASG) doping in which the over all process steps are very complicated and not applicable for smaller ground-rule devices of 0.18 μm or smaller, due to a depletion of source materials and process complexity.

Another object of the present invention is to provide a process for doping the surface layer of trenched sidewall and hemispherical grains without the necessity of using the very high temperatures and long process times required in gas-phase doping techniques that result in viscous flux of Si that cause deformation of trenches and the very small hemispherical grains.

In general, the invention process for doping of trench sidewall and hemispherical grains without the necessity of using the very high temperatures of gas-phase doping, the complicated process of arsenic glass doping that is not applicable for smaller ground-rule devices or known plasma doping techniques is accomplished by: etching of a deep trench structure in a substrate by reactive ion etching (RIE); formation of a LOCOS collar; deposition of small, thin film hemispherical grains at the sidewall of the deep trench; plasma doping of the hemispherical grains; and formation of a node dielectric prior to filling the trench with a polysilicon.

DESCRIPTION OF THE PREFERRED EMBODIMENTS

While hemispherical grain technology has been developed to increase the surface area and thus the capacitance of stacked storage cells, and hemispherical grains have also been used to increase the surface area in the case of deep trench type cells, nevertheless, for the sake of even higher capacitance, it is essential to provide very high doping levels in the hemispherical grains, which act as an electrode. In providing this even higher level of capacitance by utilizing high doping levels in the hemispherical grain silicon, high doping concentrations must be achieved in the surface layer of trenched sidewalls and hemispherical grains.

However, when affecting high doping concentrations by the use of arsenic glass (ASG) doping, it has been found that, in addition to the fact that the overall process steps utilizing arsenic glass doping are very complicated, this process is not applicable for smaller ground-rule devices (i.e., 0.18 μm or smaller) due to a depletion of source material as well as process complexities.

Although high capacitance may be achieved utilizing very high doping levels in the surface layer of trench sidewalls and hemispherical grains utilizing gas-phase doping means, it has been found that the gas-phase doping technique requires very high temperatures for relatively long process times, i.e. 1,000-1,200° C. for more than 3 minutes. Under these gas-phase doping technique conditions, these very high temperatures for the relatively long process time of more than 3 minutes results in a viscous flux of Si which leads to a deformation of the trenches and the very small hemispherical grain silicon particles.

Further, under the gas-phase doping technique, wafer warpage is at risk and this is especially the case for 300 mm technology.

In view of the encumbrances associated with the use of achieving very high doping levels in the surface layer of trench sidewall and hemispherical grains for a DRAM with deep trenches (DT) using the arsenic glass doping and gas-phase doping techniques, a much sought after goal would be an improved technique that offers a simple, cost effective, and reliable method for doping of the trench sidewall and the hemispherical grains without the aforementioned risk using very high temperatures.

The present invention process recognizes that after the formation of the hemispherical grains, the post-process steps of doping of the trench sidewalls and of the grains to assure high capacitance and the formation of a dielectric layer by deposition to fill the trench, normally with polysilicon, it is important that these two post-process steps have a low thermal budget so that the narrow trench structures and the very small grains do not deform and thereby lessen the sought after enhanced capacitance.

In the present invention, a plasma doping technique is used to perform the doping step, inasmuch as plasma doping involves the use of a low temperature <300° C., thereby affording doping of the trench sidewalls and hemispherical grains without the attendant risk of deformation of the narrow trench structures and the very small grains. Using the process of the invention, the annealing of any implanted species can be done during the node dielectric step without adding any additional anneal step.

In the preferred embodiment of the invention process, the process sequence entails:

a) Etching of a deep trench structure by reactive ion etching (REI);

b) Formation of a LOCOS collar;

c) Formation of a buried plate by low temperature plasma doing (optional);

d) Deposition of a small, thin film hemispherical grains at the sidewall of the deep trench;

e) Plasma doping of the hemispherical grains;

f) Rapid thermal processing to quickly activate the implanted species (optional);

g) Formation of the node dielectric (in which the thermal budget during this step may simultaneously anneal any implanted species from step in e) and omit any rapid thermal processing of step f); and h) Formation of a node dielectric prior to filling trench with polysilicon.

It is apparent that plasma doping can render a conformal doping in deep trenches with high surface concentrations of dopants in the trenches, as plasma doping does not involve the use of high temperatures. Further, the use of an annealing step to activate the implanted dopants is moderate and does not significantly reduce the surface doping level. The activation may be done in a separate step e.g. at 900° C. for several minutes. Also, in the process plasma doping process of the invention, a native oxide layer implanted with dopants to protect the hemispherical grains may be used as a capping layer to prevent out-diffusion during the anneal step.

Alternatively, the implanted dopants may be activated without a separate anneal step in the remaining process step in which a node dielectric is formed. This process step usually involves thermal processing at a temperature range of about 900-950° C., which is sufficient to activate the implanted dopants. Since the plasma doping can be independently optimized between the implant and anneal steps, the process window can be much wider than is the case in other competing technologies.

While the invention has been described in its preferred embodiments, those skilled in the art will recognize that many modifications may be made within the spirit and scope of the invention without departing from the inventive concept or scope, which is set forth in the appended claims.

We claim:

1. A method of doping trench sidewall and hemispherical-grained silicon in deep trench cells to increase surface area and storage capacitance while avoiding viscous flux of Si that leads to deformation of trenches and very small hemispherical-grained silicon resulting from high temperature doping, comprising:

a) Etching a deep trench structure by reactive ion etching;

b) Forming a LOCOS collar in an upper portion of said trench over a conformal layer of a silicon containing material, said collar leaving a lower portion of said trench exposed;

c) Depositing a film of hemispherical-grained silicon (HSG-Si) at sidewalls of the deep trench;

d) Plasma doping said hemispherical-grained silicon at a temperature of less than 300° C.; and e) Depositing a node dielectric and filling the trench with polysilicon.

2. The process of claim 1 wherein, between steps b) and c), a buried plate is formed by low temperature plasma doping.

3. The process of claim 1 wherein, between steps d) and e), rapid thermal processing is employed to activate any implanted species.

4. The process of claim 1 wherein, during depositing of said node dielectric temperatures are employed that simultaneously anneal implanted species from step d) and omit any need for rapid thermal processing to activate any implanted species.

5. The process of claim 3 wherein said rapid thermal processing to activate said implanted species is conducted at about 900° C. for about 2 minutes.

6. The process of claim 5 wherein a native oxide is implanted with said plasma doping as a capping layer to protect said hemispherical-grained silicon to prevent out-diffusion during annealing.

7. The process of claim 4 wherein implanted species from step d) are activated during deposition of said node dielectric at thermal processing temperatures ranging from about 900–950° C.

* * * * *